(12) United States Patent
Kahen et al.

(10) Patent No.: US 8,784,703 B2
(45) Date of Patent: Jul. 22, 2014

(54) METHOD OF MAKING HIGHLY-CONFINED SEMICONDUCTOR NANOCRYSTALS

(75) Inventors: Keith Brian Kahen, Rochester, NY (US); Matthew Holland, Victor, NY (US); Sudeep Pallikkara Kuttiatoor, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 238 days.

(21) Appl. No.: 13/275,595

(22) Filed: Oct. 18, 2011

(65) Prior Publication Data

US 2013/0092886 A1    Apr. 18, 2013

(51) Int. Cl.
*H01B 1/06* (2006.01)

(52) U.S. Cl.
USPC ............. 252/519.4; 252/512; 252/518.1; 252/521.5; 257/13; 257/14; 257/21; 257/22; 257/79; 420/523; 420/525; 420/579; 438/29; 438/47; 438/509

(58) Field of Classification Search
USPC ........... 252/301.3, 512, 519.4, 518.1, 521.5; 435/7.2; 438/29, 47, 509; 257/14, 21, 257/22, 79, 13; 356/317; 420/523, 525, 579
See application file for complete search history.

(56) References Cited

U.S. PATENT DOCUMENTS

| | | | |
|---|---|---|---|
| 6,322,901 B1 | 11/2001 | Bawendi et al. | |
| 7,056,471 B1 * | 6/2006 | Han et al. | 420/523 |
| 2005/0287691 A1 * | 12/2005 | Chen et al. | 438/29 |
| 2007/0034833 A1 | 2/2007 | Parce et al. | |
| 2008/0064121 A1 | 3/2008 | Weiss et al. | |
| 2009/0109435 A1 * | 4/2009 | Kahen et al. | 356/317 |
| 2010/0140586 A1 | 6/2010 | Char et al. | |
| 2012/0270231 A1 * | 10/2012 | Smith et al. | 435/7.2 |

FOREIGN PATENT DOCUMENTS

| | | |
|---|---|---|
| EP | 1 666 562 | 6/2006 |
| WO | 03/092043 | 1/2004 |
| WO | 2012/109046 | 8/2012 |

OTHER PUBLICATIONS

Mueller-Mach et al, Highly efficient all-nitride phosphor-converted white light emitting diode, Phys. Stat. Sol. A, 202 (9) 1727 (2005).
McBride et al, Structural Basis for Near Unity Quantum Yield Core/Shell Nanostructures, Nano Lett. 6 (7) 1496 (2006).
Pradham et al, An Alternative of CdSe Nanocrystal Emitters: Pure and Tunable Impurity Emissions in ZnSe Nanocrystals, J. Am Chem. Soc. 127 (50), 17586 (2005).

(Continued)

*Primary Examiner* — Khanh Tuan Nguyen
(74) *Attorney, Agent, or Firm* — Raymond L. Owens

(57) ABSTRACT

A method of making a colloidal solution of high confinement semiconductor nanocrystals includes: forming a first solution by combining a solvent, growth ligands, and at most one semiconductor precursor; heating the first solution to the nucleation temperature; and adding to the first solution, a second solution having a solvent, growth ligands, and at least one additional and different precursor than that in the first solution to form a crude solution of nanocrystals having a compact homogenous semiconductor region. The method further includes: waiting 0.5 to 20 seconds and adding to the crude solution a third solution having a solvent, growth ligands, and at least one additional and different precursor than those in the first and second solutions; and lowering the growth temperature to enable the formation of a gradient alloy region around the compact homogenous semiconductor region, resulting in the formation of a colloidal solution of high confinement semiconductor nanocrystals.

8 Claims, 4 Drawing Sheets

(56) References Cited

OTHER PUBLICATIONS

Pradham et al, Efficient and Color-Tunable Mn-Doped ZnSe Nanocrystal Emitters: Control of Optical Performance via Greener Synthetic Chemistry, J. Am. Chem. Soc. 129 3339 (2007).

Berasis et al, Luminescent Materials and Applications—Phosphor Quantum Dots, 2008, John Wiley and Sons Ltd. pp. 18-65.

Chen et al, "Giant" Multishell CdSe Nanocrystal Quantum Dots with Suppressed Blinking, J. Am. Chem. Soc. 130 (15) 5026 (2008).

Tanaka et al, Very weak temperature quenching in orange luminescence of ZnS:Mn2+ nanocrystals in polymer, Chem. Phys. Let, 324 (4) 249 (2000).

Salvador et al, Exciton-phonon coupling and disorder in the excited states of CdSe colloidal quantum dots, J. Chem Phys. 125 184709 2006.

Alivisatos et al, Electron-vibration coupling in semiconductor clusters studied by resonance Raman spectroscopy, J. Chem Phys 90 3463 1989.

Sagar et al, State-Resolved Exciton-Phonon Couplings in CdSe Semiconductor Quantum Dots, J. Phys Chem. C112, 9124, 2008.

Schmitt-Rink et al, Theory of the linear and nonlinear optical properties of semiconductor microcyrstallites, Phys. Rev. B35, 8113 (1987).

Murray et al, Synthesis and Chracterization of Monodisperse Nanocrystals and Close-Packed Nanocrystal Assemblies, Annu. Rev. Mater. Sci. 30, 545, 2000.

Hines et al, Synthesis and Characterization of Strongly Luminescing ZnS-Capped CdSe Nanocrystals, J. Phys. Chem. 100, 468 (1996).

Masala et al, Synthesis Routes for Large Volume of Nanoparticles, Annu. Rev. Mater. Res. 34, 41 (2004).

Ryu et al, Step-Wise Synthesis of InP/ZnS Core-Shell Quantum Dots and the Role of Zinc Acetate, Chem. Mater. 21, 573 (2009).

Talapin et al, Etching of Colloidal InP Nanocrystals with Fluorides: Photochemical Nature of the Process Resulting in High Photoluminescence Efficiency, J. Phys. Chem. B 106, 12659 (2002).

Chemistry of Materials, vol. 21, No. 4, Feb. 24, 2009, by Euidock Ryu, et al, pp. 573-757; XP008150537.

* cited by examiner

METHOD OF MAKING HIGHLY-CONFINED SEMICONDUCTOR NANOCRYSTALS

STATEMENT REGARDING FEDERALLY-SPONSORED RESEARCH OR DEVELOPMENT

This invention was made with Government support under Cooperative Agreement #DE-EE000979 awarded by DOE. The Government has certain rights in this invention.

CROSS-REFERENCE TO RELATED APPLICATIONS

Reference is made to commonly assigned U.S. patent application Ser. No. 13/024,555 filed Feb. 10, 2011, entitled "Indium Phosphide Colloidal Nanocrystals" by Xiaofen Ren et al, and U.S. patent application Ser. No. 13/275,424 filed Oct. 18, 2011, entitled "Highly-Confined Semiconductor Nanocrystals" by Keith B. Kahen et al, the disclosures of which are incorporated herein.

FIELD OF THE INVENTION

The present invention relates to forming nanocrystals, wherein the inner homogenous region of the core is highly confined.

BACKGROUND OF THE INVENTION

For solid-state lighting applications, the fastest route to high efficiency white LEDs is to combine either blue, violet, or near UV LEDs with appropriate phosphors. The prototypical conventional phosphor is $Ce^{3+}$-doped $Y_3Al_5O_{12}$ (YAG:Ce), a yellow emitter which in its commercial form from Nichia has a quantum efficiency of 70%. Recently, progress has been made in creating highly efficient green-yellow and red phosphors using nitridosilicates (R. Mueller-Mach et al., Phys. Stat. Sol. A, 202 (9), 1727 (2005)). Despite the very good quantum efficiencies of conventional phosphors, they suffer from enhanced optical backscattering due to their large size and it is difficult to tune their emission response in order to get spectra with specific correlated color temperatures (CCT) having high color rendering index (CRI) values.

A way to overcome the backscattering loss issue is to form colloidal quantum dot phosphors. As is well known the crystallinity of colloidal quantum dots can be made to be very high which results in solution quantum yields being 80-90%, and sometimes nearly 100% (J. McBride, et al., Nano Lett. 6 (7), 1496 (2006)). In addition to the reduced scattering losses, colloidal quantum dot phosphors also enjoy the advantages of ease of color tuning, improved CRI, a lower cost deposition process, and a broader wavelength spectrum for optical pumping. Despite these advantages, colloidal quantum dot phosphors have not been introduced into the marketplace due to two major shortcomings; namely, poor temperature stability (thermal quenching of quantum efficiency) (N. Pradhan et al., J. Am. Chem. Soc. 127 (50), 17586 (2005)) and low (10-20%) quantum yields for phosphor films with high quantum dot packing densities. One way to get around the non-ideal temperature stability of colloidal quantum dots is to dope the nanocrystals with impurity atoms, as was done by Peng and co-workers (N. Pradhan et al., J. Amer. Chem. Soc. 129, 3339 (2007)), where it was found that Mn-doped ZnSe nanocrystals maintained a reasonable thermal stability up to ~250° C. The disadvantages of this approach are that the peak emission wavelengths of the nanocrystals are limited by the particular choice of dopant materials, the spectral widths of the photoluminescence are typically larger for impurity emission, and the quantum efficiency of these types of nanocrystals is below that of undoped nanocrystals.

Turning back to the undoped nanocrystals, an important channel for non-radiative energy decay is the transfer of the carriers (electron or hole) or exciton energy to the surface defects (D. Berasis et al., "Luminescent Materials and Applications", 2008 John Wiley & Sons Ltd., pg. 19). This pathway is enhanced at higher temperatures since the electron and hole wavefunctions will overlap with the surface region to a greater extent at higher temperatures. One way to minimize the overlap of the electrons and holes with the surface impurities is to grow nanocrystals with very thick shells (Y. Chen et al., J. Am. Chem. Soc., 130 (15), 5026 (2008)). The problems with this approach are that the shell growth times can be prohibitively long and the quantum efficiency tends to fall for very thick shells due to their greater propensity for defect formation. One way for reducing the thickness of the shell, while increasing the quality of the shell growth is to use outer shells of the widest bandgap, such as, ZnS for CdSe, while employing a graded shell interface region to enable a smooth transition from the core to the shell regions, for example, varying from the CdSe-like core to the ZnS-like outer shell region (K. Char et al., U.S. Patent Application Publication 2010/0140586; S. Weiss et al., U.S. Patent Application Publication 2008/0064121; and J. Treadway et al., WO 2003/092043). Though a reasonable way for preventing the electrons and holes from feeling the effects of the nanocrystal surface, in all three of these cases the core regions are at least 2 nm in diameter; which are typical of quantum dots, and thus would show the typical thermal responses associated with core diameters of these sizes.

To date, traditional (not employing impurity dopants) nanocrystals suffer from poor thermal stability which limits the usefulness of these materials in high temperature applications, such as, high power LEDs and nanocrystal-based lasers. Some nanocrystals have been engineered for minimizing the impact of the shell surface states on the radiative recombination of the electrons and holes. However, the engineered nanocrystals had other problems, such as, reduced quantum efficiencies at room temperature. As such, there is a need for a new class of colloidal nanocrystals, which have very good quantum efficiencies at room temperature, and maintain these efficiencies at elevated temperatures.

SUMMARY OF THE INVENTION

The present invention relates to an effective method for forming high confinement semiconductor nanocrystals. In accordance with this aspect, there is provided a method of making a colloidal solution of high confinement semiconductor nanocrystals, comprising:

(a) forming a first solution by combining a solvent, growth ligands, and at most one semiconductor precursor;

(b) heating the first solution to the nucleation temperature;

(c) adding to the first solution, a second solution having a solvent, growth ligands, and at least one additional and different precursor than that in the first solution to form a crude solution of nanocrystals having a compact homogenous semiconductor region;

(d) waiting for 0.5 to 20 seconds and then adding to the crude solution a third solution having a solvent, growth ligands, and at least one additional and different precursor than those in the first and second solutions; and (e) lowering the growth temperature to enable the formation of a gradient alloy region around the compact homogenous semiconductor region, resulting in the formation of a colloidal solution of high confinement semiconductor nanocrystals.

It is an advantage of the present invention that the high confinement semiconductor nanocrystals formed in accordance with the present invention exhibit the desirable properties of good quantum efficiencies (>70%) at room temperature and maintain these good quantum efficiencies at elevated temperatures (up to temperatures of ~175° C.). It is also an advantage that the electron-phonon interaction is reduced in these nanocrystals. Another benefit of the present invention is that high confinement semiconductor nanocrystals exhibiting these properties can be used to create advantaged quantum dot phosphors, high intensity LEDs, and both optically and electrically pumped lasers.

DETAILED DESCRIPTION OF THE INVENTION

Figure 1:
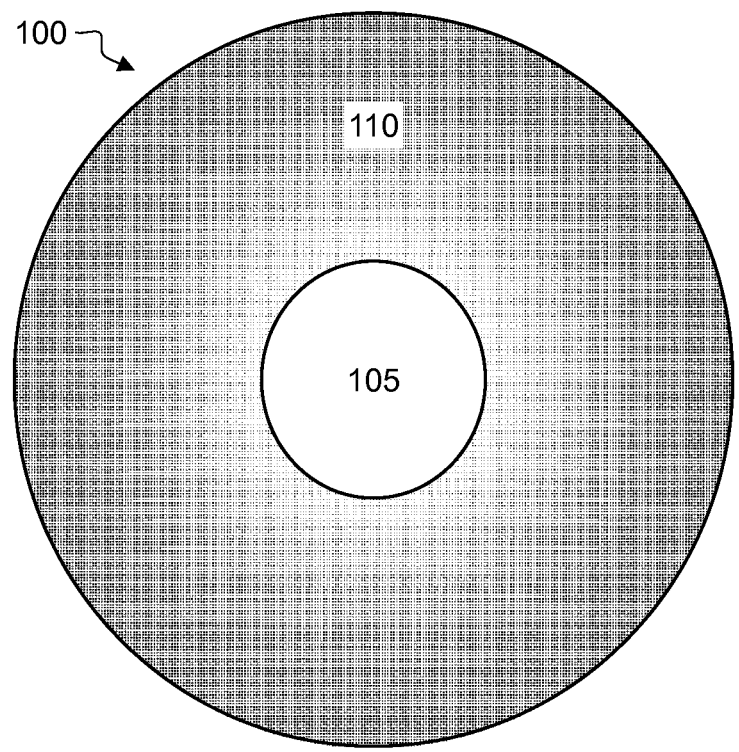
FIG. 1 shows a schematic of a high confinement semiconductor nanocrystal.

It is well known that the quantum efficiency falls off for bulk doped ZnS at higher temperatures, while the fall-off is reduced for doped nanophosphors of ZnS. The difference in thermal stability was ascribed to two possible effects (M. Tanaka et al., Chem. Phys. Lett. 324 (4), 249 (2000)), namely, reduced exciton dissociation and reduced exciton-phonon coupling of the Frohlich type, both of which are due to the enhanced electron-hole confinement in nanocrystals. The improved thermal stability of colloidal quantum dots (as compared to bulk crystalline materials) is already evident from their high efficiencies at room temperature; however, the problem lies in maintaining these stabilities at temperatures well above 25° C. As can be seen from the above discussions, the keys properties to focus on are: 1) Maintaining stable excitons, 2) Preventing the electrons and holes from sampling the surface states, and 3) Minimizing the electron-phonon interaction. All three properties are more problematic at elevated temperatures. The first two properties are well-known effects, the third one requires additional explanation. There are two types of phonons, acoustic and optical. The emphasis here will be on the coupling to the optical phonons, since the coupling strength to the acoustic phonons is known to be small and typically prominent only at cryogenic temperatures (M. Salvador, J. Chem. Phys. 125, 184709 (2006)). As is well known (A. Alivisatos, J. Chem. Phys. 90, 3463 (1989)), the coupling to the optical phonons is minimized as the overlap between the electron and hole wavefunctions increases, thus reducing the corresponding polarization charge. Consequently in the ideal case, highly confined electrons and holes would have minimized electron-phonon interactions. It has been discussed that some of the larger reported electron-phonon couplings for nanocrystals are due to trapped surface charges, which can be minimized by performing time domain measurements with femtosecond pump lasers (D. Sagar, J. Phys. Chem. C112, 9124 (2008)). Naturally, the trapped charge enhances the polarization of the excited carrier distribution, resulting in enhanced electron-phonon couplings. This surface state charging has important ramifications for practical applications, where the nanocrystals would be continuously excited. Consequently for these situations, minimizing the electron-phonon coupling also requires that the excited electrons and holes be prevented from being trapped by the surface states. This effect of the surface states is in addition to their direct impact on the quantum efficiency through trapping of one of the carriers and thus preventing the electrons and holes from direct recombination.

Combining these results, the inventive nanocrystals have the attributes of significantly reducing the polarization charge of the combined electron and hole distributions, while simultaneously preventing, to a large extent, either charge distribution from sampling the surface states of the nanocrystals. (Note that the third property of stable excitons is a natural consequence of minimizing the polarization charge.) The issues associated with trapped charge can be generalized to include any internal defects in the nanocrystals that also need to be minimized in order to improve the thermal stability of the nanocrystals. Naturally, having a high, room-temperature quantum efficiency is indicative of a minimum of internal defects and successful passivation of the surface states. If some of the passivation is done through the use of organic ligands (which is typically the case), then high quantum efficiency at elevated temperature either requires temperature stable organic ligands (this includes stable bonds with the semiconductor surface) or preventing either charge distribution from sampling the surface states of the nanocrystal. The most straightforward means for satisfying these requirements is to construct a nanocrystal wherein the electrons and holes are tightly confined to a center region of the nanocrystal, where the radius of the region is much smaller than the exciton Bohr radius. For the case of highly confined regions surrounded by infinite barriers, the energies of both the electrons and holes are dominated by their respective kinetic energies and their corresponding wavefunctions are identical (S. Schmitt-Rink, Phys. Rev. B35, 8113 (1987)). In addition, by tightly confining the electrons and holes to the center region of the nanocrystal, they are largely prevented from sampling the surface region of the nanocrystal.

For some semiconductor nanocrystal systems, the Bohr radius can be quite large (34 nm in InAs, 46 nm in PbSe, and 54 nm in InSb). However, in more prototypical quantum dots, such as, CdSe and InP, the Bohr radii are 6 and 11 nm, respectively. Focusing on these cases for now, the highly confined center region should have a diameter less than 2.0 nm, preferably in the range of 1.0 to 2.0 nm. Forming typical core-shell nanocrystals occurs by the process of growing the cores in the 260-310° C. range, lowering the temperature to typical shelling values of ~190° C. (adding some additional ligands if necessary) and then dripping in the shell precursors. The problem with this generic procedure, especially when the core diameter is less than 2.0 nm, is that the small core nanocrystals are dominated by surface states, which makes it problematic to shell them properly. Also, since the crystalline quality of II-VI and many III-V nanocrystals is the highest when the nanocrystals are grown in the 270-310° C. range, preparing small-diameter nanocrystals is difficult to control, especially without some growth occurring at lower temperatures. Thus, it would be best to form a nanocrystal that combines a highly confined core center region with an outer confinement layer, such that both are grown during the same process (and at analogous temperatures) and the resulting overall nanocrystal is defect free.

Given the above requirements, the inventive high confinement semiconductor nanocrystal 100 is schematically illustrated in FIG. 1. The nanocrystal includes two sections, a compact homogenous semiconductor region 105, in the center area of the high confinement semiconductor nanocrystal 100, and a gradient alloy region 110, which extends from the surface of the compact homogenous semiconductor region 105 to the surface of the high confinement semiconductor nanocrystal 100. As discussed above the diameter of the compact homogenous semiconductor region 105 is less than 2.0 nm, with a preferred range of 1.0 to 2.0 nm. The compact homogenous semiconductor region 105 is confined by a gradient alloy region since it enables the confinement layer to be grown simultaneously with the highly confined core area (and at the same temperatures), while reducing the defects associated with the shelling of the very small cores by employing a gradient alloy composition instead of an abrupt change in semiconductor material. Choosing the illustrative case of InP-based high confinement semiconductor nanocrystals, the compact homogenous semiconductor region 105 is composed of InP, while the gradient alloy region 110 is composed of InGaP, in which the Ga content increases from the surface of the compact homogenous semiconductor region 105 to the surface of the gradient alloy region 110. This results in the electrons and holes of the compact homogenous semiconductor region 105 being confined by the potential energy barriers of the gradient alloy region 110. The thickness of the gradient alloy region 110 needs to be sufficient to enable proper confinement, with a desired range of 2 to 20 monolayers. With regard to the compositional structure of the gradient alloy region 110, the only constraint on the varying alloy composition is that the confinement of the layers increases as the position of the materials proceeds away from the center of the nanocrystal. Taking the example of the gradient alloy region 110 being composed of InGaP, the Ga content can increase linearly, quadratically, or exponentially (or combinations thereof) away from the surface of the compact homogenous semiconductor region 105. Other functional dependencies for the Ga content variation are possible.

The compact homogenous semiconductor region 105 is composed of homogenous binary or ternary semiconductor material. Illustrative semiconducting materials are II-VI, III-V, or IV-VI compounds. Representative binary materials are CdSe, CdS, CdTe, ZnTe, InP, InSb, InAs, GaAs, GaSb, PbSe, PbS, and PbTe, while representative ternary materials are CdSeS, InAsP, InSbP, and PbSeS. Other binary or ternary combinations are possible. For the gradient alloy region 110, again illustrative semiconducting materials are II-VI, III-V, or IV-VI compounds. For the case that the compact homogenous semiconductor region 105 is composed of homogenous binary semiconductor material, the gradient alloy region 110 is composed of ternary or quaternary semiconductor material. Correspondingly, for the case that the compact homogenous semiconductor region 105 is composed of homogenous ternary semiconductor material, the gradient alloy region 110 is composed of quaternary semiconductor material. Representative quaternary materials are ZnMgSeSe, CdZnSeS, and InAlAsP. Other quaternary combinations are possible. As can be seen from the above, it is preferable that the high confinement semiconductor nanocrystal 100 is composed of semiconductors from the same family (III-V, II-VI, or IV-VI) in order to reduce defect formation. Thus, as an example, both the compact homogenous semiconductor region 105 and the gradient alloy region 110 are composed of III-V material.

The quantum efficiency and environmental stability of nanocrystals can be increased by shelling them with wider bandgap semiconductor materials. Additionally, as discussed above, good temperature stability is aided by preventing the electron and hole wavefunctions from sampling the surface of the overall nanocrystals. Appropriate shelling is easiest to illustrate by two examples. In the first one the compact homogenous semiconductor region 105 is composed of CdSe, while the gradient alloy region 110 is composed of CdZnSe, with the Zn content of the alloy region being highest at the surface of the high confinement semiconductor nanocrystal 100. Some appropriate wider bandgap semiconductor materials for shelling the Cd-based high confinement semiconductor nanocrystal 100 are ZnSe, ZnS, ZnSeS, ZnMgSe, ZnMgS, and ZnMgSeS. The shelling materials should be chosen to reduce the lattice constant variation, while improving the electron and hole confinement. Given these principles, for the Cd-based high confinement semiconductor nanocrystal 100, one particular shell combination is ZnSe, followed by ZnSeS and then ZnS. In general, the thickness and type of each shell layer is also varied in order to enhance the quantum efficiency and temperature stability of the overall nanocrystals. Each shell layer can have a thickness from 1 to 20 monolayers, with the number of possible different shell materials being unlimited (since the shell layers can be composed of either binary, ternary, or quaternary semiconductor material, or combinations thereof). Taking the second case of the compact homogenous semiconductor region 105 composed of InP, while the gradient alloy region 110 is composed of InGaP, this structure can be shelled with either wide bandgap III-V or II-VI materials, with the latter being the more common choice, as is well known in the art. Going this route, one particular shell combination is again ZnSe, followed by ZnSeS and then ZnS. In the general the shells can be composed of II-VI, III-V, or IV-VI semiconductor materials, or combinations thereof.

A number of procedures can be applied for creating the high confinement semiconductor nanocrystal 100. One particular approach will be related in detail. Shelling of the nanocrystals follows standard processes in the art; however, some representative shelling procedures will also be discussed. As a first step, the compact homogenous semiconductor region 105 composed of binary or ternary semiconductor material needs to be synthesized by well-known procedures in the art. A typical synthetic route is decomposition of molecular precursors at high temperatures in coordinating solvents (C. B. Murray et al., Annu Rev. Mater. Sci. 30, 545 (2000)). When forming homogenous ternary compounds on the cation sublattice for example, the two cation precursors need to be chosen to have matched reactivities in order to ensure that the resulting core center is homogenous in semiconductor content. Analogous comments pertain to forming ternary compounds on the anion sublattice. The binary or ternary compact homogenous semiconductor region 105 is preferably composed of II-VI, III-V, or IV-VI semiconducting material. Other processes have been employed to form core nanocrystals, such as, solvothermal methods, however, they do not lend themselves to creating the gradient alloy region 110. Since the sizes of the compact homogenous semiconductor region 105 are small (less than 2.0 nm in diameter), it is important that the growth rate of the nanocrystals be constrained in order to enable nanocrystals of these sizes. For example, the growth rate for typical CdSe nanocrystals is very high, however, adding tetradecylphosphonic acid (TDPA) to the growth ligands is known to significantly reduce the CdSe growth rate, while enabling the formation of high quality nanocrystals. Besides the addition of growth-restraining ligands, another scheme for reducing the growth rate is to reduce the initial precursor concentrations. To make these ideas more concrete, a typical growth process for forming the compact homogenous semiconductor region 105 will involve: 1) Adding into a flask a first solution comprised of a solvent (either coordinating or non-coordinating), some growth ligands, and at most one nanocrystal precursors (sometimes the precursors are only added in step 3); 2) Heating the flask to the nanocrystal nucleation temperature, while vigorously stirring its contents; 3) Adding to a first syringe, a second solution containing a solvent, at least one additional and different precursor than that in the first solution, and some growth ligands; and 4) Swiftly injecting the contents of the syringe into the heated flask to form a crude solution composed of nanocrystals having a compact homogenous semiconductor region. The growth rate of the compact homogenous semiconductor region 105 determines the time delay between the step 4 injection and the injection of the additional precursors that enable the formation of the gradient alloy region 110. This time delay can typically vary from 0.5 s to 20 s. Commonly the above process is performed under airless conditions involving conventional dry boxes and Schlenk lines. The growth temperatures for the nanocrystals composed of column II-VI and III-V materials are typically between 250 and 320° C., in order to obtain materials of the highest quality.

In the present invention, it is preferable that the cation used for synthesizing the high confinement semiconductor nanocrystal 100 is a group IIb, IIIa, or IVa material. Some examples of group IIb cation precursors are $Cd(Me)_2$, CdO, $CdCO_3$, $Cd(Ac)_2$, $CdCl_2$, $Cd(NO_3)_2$, $CdSO_4$, ZnO, $ZnCO_3$, $Zn(Ac)_2$, $Zn(Et)_2$, $Hg_2O$, $HgCO_3$ and $Hg(Ac)_2$. Some examples of group IIIa cation precursors are $In(Ac)_3$, $InCl_3$, $In(acac)_3$, $In(Me)_3$, $In_2O_3$, $Ga(acac)_3$, $GaCl_3$, $Ga(Et)_3$, and $Ga(Me)_3$. Other appropriate cation precursors can also be used as is well known in the art. It is preferred that the anion precursor used for the synthesis of the high confinement semiconductor nanocrystal 100 is a material selected from a group consisting of S, Se, Te, N, P, As, and Sb. Some examples of corresponding anion precursors are bis(trimethylsilyl)sulfide, tri-n-alkylphosphine sulfide, hydrogen sulfide, tri-n-alkenylphosphine sulfide, alkylamino sulfide, alkenylamino sulfide, tri-n-alkylphosphine selenide, alkenylamino selenide, tri-n-alkylamino selenide, tri-n-alkenylphosphine selenide, tri-n-alkylphosphine telluride, alkenylamino telluride, tri-n-alkylamino telluride, tri-n-alkenylphosphine telluride, tris(trimethylsilyl) phosphine, triethylphosphite, sodium phosphide, potassium phosphide, trimethylphosphine, tris(dimethylamino)phosphine, tricyclopentylphosphine, tricyclohexylphosphine, triallylphosphine, di-2-norbornylphosphine, dicyclopentylphosphine, dicyclohexylphosphine, dibutylphosphine, tris(trimethylsilyl)arsenide, bis(trimethylsilyl)arsenide, sodium arsenide, and potassium arsenide. Other appropriate anion precursors can also be used as is well known in the art.

A wealth of suitable high boiling point compounds exist that can be used both as reaction media and, more importantly, as coordination ligands to stabilize the metal ion after it is formed from its precursor at high temperatures. They also aid in controlling particle growth and impart colloidal properties to the nanocrystals. Among the different types of coordination ligands that can be used are alkyl phosphine, alkyl phosphine oxide, alkyl phosphate, alkyl amine, alkyl phosphonic acid, and fatty acids. The alkyl chain of the coordination ligand is preferably a hydrocarbon chain of length greater than 4 carbon atoms and less than 30 carbon atoms, which can be saturated, unsaturated, or oligomeric in nature. It can also have aromatic groups in its structure.

Specific examples of suitable coordination (growth) ligands and ligand mixtures include, but are not limited to, trioctylphosphine, tributylphosphine, tri(dodecyl)phosphine, trioctylphosphine oxide, tributylphosphate, trioctyldecyl phosphate, trilauryl phosphate, tris(tridecyl)phosphate, triisodecyl phosphate, bis(2-ethylhexyl)phosphate, tris(tridecyl) phosphate, hexadecylamine, oleylamine, octadecylamine, bis(2-ethylhexyl)amine, octylamine, dioctylamine, cyclododecylamine, n,n-dimethyltetradecylamine, n,n-dimethyldodecylamine, phenylphosphonic acid, hexyl phosphonic acid, tetradecyl phosphonic acid, octylphosphonic acid, octadecyl phosphonic acid, propylphosphonic acid, aminohexyl phosphonic acid, oleic acid, stearic acid, myristic acid, palmitic acid, lauric acid, and decanoic acid. Further, they can be used by diluting the coordinating ligand with at least one solvent selected from a group consisting of 1-nonadecene, 1-octadecene, cis-2-methyl-7-octadecene, 1-heptadecene, 1-pentadecene, 1-tetradecenedioctylether, dodecyl ether, and hexadecyl ether, or the like.

In some embodiments to form nanocrystals composed of III-V materials, the growth ligands include column II metals, including Zn, Cd or Mg. In some advantageous embodiments, the zinc compound is zinc carboxylate having the formula:

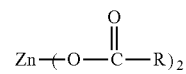

where R is a hydrocarbon chain of length equal to or greater than 1 carbon atom and less than 30 carbon atoms, which are saturated, unsaturated, or oligomeric in nature. It can also have aromatic groups in its structure. Specific examples of suitable zinc compounds include, but are not limited to, zinc acetate, zinc undecylenate, zinc stearate, zinc myristate, zinc laurate, zinc oleate, or zinc palmitate, or combinations thereof.

Examples of non-coordinating or weakly coordinating solvents include higher homologues of both saturated and unsaturated hydrocarbons. Mixture of two or more solvents can also be used. In some embodiment, the solvent is selected from unsaturated high boiling point hydrocarbons, $CH_3(CH_2)_nCH=CH_2$ wherein n=7-30, such as, 1-nonadecene, 1-octadecene, 1-heptadecene, 1-pentadecene, or 1-eicosene, based on the reaction temperature.

The solvents used in the first syringe can be coordinating or non-coordinating, a list of possible candidates being given above. It is preferred that the solvent have a boiling point above that of the growth temperature; as such, prototypical coordinating and non-coordinating solvents are trioctylphosphine and octadecene, respectively.

Following the completion of step 4, the compact homogenous semiconductor region 105 is permitted to grow for the appropriate time (to get to a diameter of less than 2.0 nm), before beginning the formation of the gradient alloy region 110 that surrounds it. Its formation requires filling a second syringe with a third solution containing a solvent, appropriate growth ligands, and additional precursor(s) that result in the formation of a ternary or quaternary gradient alloy region 110. As stated above, the time delay between injecting the first and second syringes is typically 0.5 to 20 s. As for the first syringe, the second syringe is injected rapidly. Following its injection, the growth temperature is lowered (typically 10 to 50° C. below that of the nucleation growth temperature) and the gradient alloy region 110 is permitted to grow for the appropriate time (varying from 1 to 60 minutes).

Examples of common solvents and growth ligands for the second syringe have been discussed above in reference to those for the first syringe. The list of possible additional precursor(s) is also the same as that given above for forming the compact homogenous semiconductor region 105. To form a ternary or quaternary gradient alloy the additional precursors can either be cations or anions. In order to properly grow the gradient alloy region 110 it is important that the additional precursors have matched reactivities to those of the initial ones. More particularly, taking the example of an InP-based compact homogenous semiconductor region 105 formed from trimethylindium and tris(trimethylsilyl)phosphine, then for a gradient alloy region 110 composed of InGaP, the chosen Ga precursor should have matched reactivities to that of trimethylindium. Otherwise, the tris(trimethylsilyl)phosphine will react preferentially with the trimethylindium to form InP, and not InGaP. An example of a precursor with matched reactivities to that of trimethylindium is triethylgallium.

Following the formation of the gradient alloy region 110, single or multiple shelling layers can be added onto the high confinement semiconductor nanocrystal 100 by well-known procedures in the art. The shelling is typically accomplished via the decomposition of molecular precursors at high temperatures in coordinating solvents (M. A. Hines et al., J. Phys. Chem. 100, 468 (1996)). Additional discussions of forming semiconducting shells on nanocrystal cores can be found in Masala (O. Masala and R. Seshadri, Annu Rev. Mater. Res. 34, 41 (2004)) and U.S. Pat. No. 6,322,901. The shell(s) can be composed of II-VI, III-V, or IV-VI semiconducting materials. For III-V based nanocrystals, it is common to shell with II-VI materials due to their wider bandgaps and as a result of well-known experimental difficulties associated with shelling III-V materials. Focusing on shelling with II-VI compounds, the shelling temperatures are typically from 170 to 230° C. In order to avoid the formation of nanocrystals formed solely of the shelling material, the shell precursors are either slowly drip together or the shell precursors are added one-half monolayer at a time (again typically at a slow rate). When using II-VI materials to shell the III-V based high confinement semiconductor nanocrystals 100, it is also preferred that the surface of the nanocrystals be etched in weak acids (E. Ryu et al., Chem. Mater. 21, 573 (2009)) and then annealed at elevated temperatures (from 180 to 260° C.) prior to shelling. A useful weak acid is acetic acid. As a result of the acid addition and annealing, the high confinement semiconductor nanocrystals 100 tend to aggregate, and therefore it is desirable that ligands be added to the growth solution prior to initiation of the shelling procedure. Useful ligands are primary amines, such as, hexadecylamine, or acid-based amines, such as, oleylamine. Continuing with the example of InP/InGaP based high confinement semiconductor nanocrystals 100, a useful shell would be a multiple one comprising shell layers of ZnSe, ZnSeS, and ZnS. The shell thicknesses and S content of the middle shell are determined by optimizing the nanocrystals for quantum efficiency and temperature stability. It is also beneficial to anneal the nanocrystals near the shelling temperatures following each shelling step for times ranging from 10 to 30 minutes.

The following examples are presented as further understandings of the present invention and are not to be construed as limitations thereon.

Example I-1

Preparation of the Inventive Shelled High Confinement Semiconductor Nanocrystals, InP/InGaP/ZnSe/ZnSeS/ZnS All synthetic routes were carried out using standard airless procedures with a dry box and a Schlenk line. In one growth step both the compact homogenous semiconductor region 105, composed of InP, and the gradient alloy region 110, composed of InGaP, are formed. 0.12 g (0.52 mmol) myristic acid, 0.045 g (0.1 mmol) Zn undecylenate and 7 ml 1-octadecene (ODE) were loaded into a three neck flask. The mixture was degassed at 100° C. for 1 hour. After switching to $N_2$ overpressure, the flask contents were heated to 300° C., while vigorously stirring its contents. Two precursor solutions were prepared and loaded into corresponding syringes. The first precursor solution contained 0.013 g (0.08 mmol) trimethylindium ($In(Me)_3$), 0.012 g (0.048 mmol) tris(trimethylsilyl)phosphine ($P(TMS)_3$), 0.08 mmol oleylamine and 2 ml ODE; the second precursor solution contained 0.013 g (0.08 mmol) triethylgallium ($Ga(Et)_3$), 0.08 mmol oleylamine and 1.5 ml ODE. When the reaction flask reached 300° C., the first syringe was quickly injected into the hot flask to form InP. After a time delay of 0.5 to 1.0 s, the second syringe was rapidly injected into the hot flask to form the gradient alloy region of InGaP. After the second injection, the flask temperature was lowered to 270° C. and the nanocrystals were grown for 36 minutes in total. The reaction was stopped by removing the heating source.

The above III-V based nanocrystals were shelled with wide bandgap II-VI materials. The shelling begins with the weak acid etch of the nanocrystals. After the reaction flask was cooled to room temperature under continuous stirring, 150 ul (2.6 mmol) degassed acetic acid was loaded into a syringe and then injected into the flask. This was followed by annealing the contents of the flask for 60 minutes at 240° C. Since the nanocrystals aggregated following this step, the reaction flask was cooled to 190° C., 0.5 ml (1.5 mmol) oleylamine was injected into the flask, and its contents were annealed at 190° C. for 10 minutes.

Multiple ZnSeS-based shells were grown on the etched nanocrystals by the following procedure. Precursor solutions of diethylzinc (DEZ), selenium and sulfur were prepared in a dry box prior to growing the shells. The first solution of 0.315 mmol DEZ and 1 ml ODE was added dropwise to the reaction mixture under vigorous stirring; the flask contents were then annealed at 190° C. for 10 minutes to form a one-half monolayer of Zn. A second solution of 0.028 g (0.35 mmol) selenium, 200 ul tri-n-butylphosphine, and 1.5 ml ODE was then added dropwise to the reaction mixture under vigorous stirring; the flask contents were then annealed at 190° C. for 10 minutes to form the one-half monolayer of Se. Combining the two one-half monolayers resulted in the formation of the ZnSe shell. The second shell of $ZnSe_{0.25}S_{0.75}$ (by material content) was then grown by dripping in a solution of 0.61 mmol DEZ, 200 ul tri-n-butylphosphine, 0.01 g (0.13 mmol) selenium, 0.012 g (0.037 mmol) sulfur, and 2.5 ml ODE under vigorous stirring. The flask contents were then annealed at 190° C. for 10 minutes. After the growth of the second shell, 0.09 g (0.39 mmol) myristic acid and 1 ml toluene were injected quickly into the reaction mixture and the flask contents were annealed for 10 minutes at 190° C. The third shell of ZnS was grown by dripping in a solution of 1.2 mmol DEZ, 200 ul tri-n-butylphosphine, 0.033 g (1 mmol) sulfur, and 2 ml ODE under vigorous stirring. This was followed by annealing at 190° C. for 10 minutes.

Figure 2:
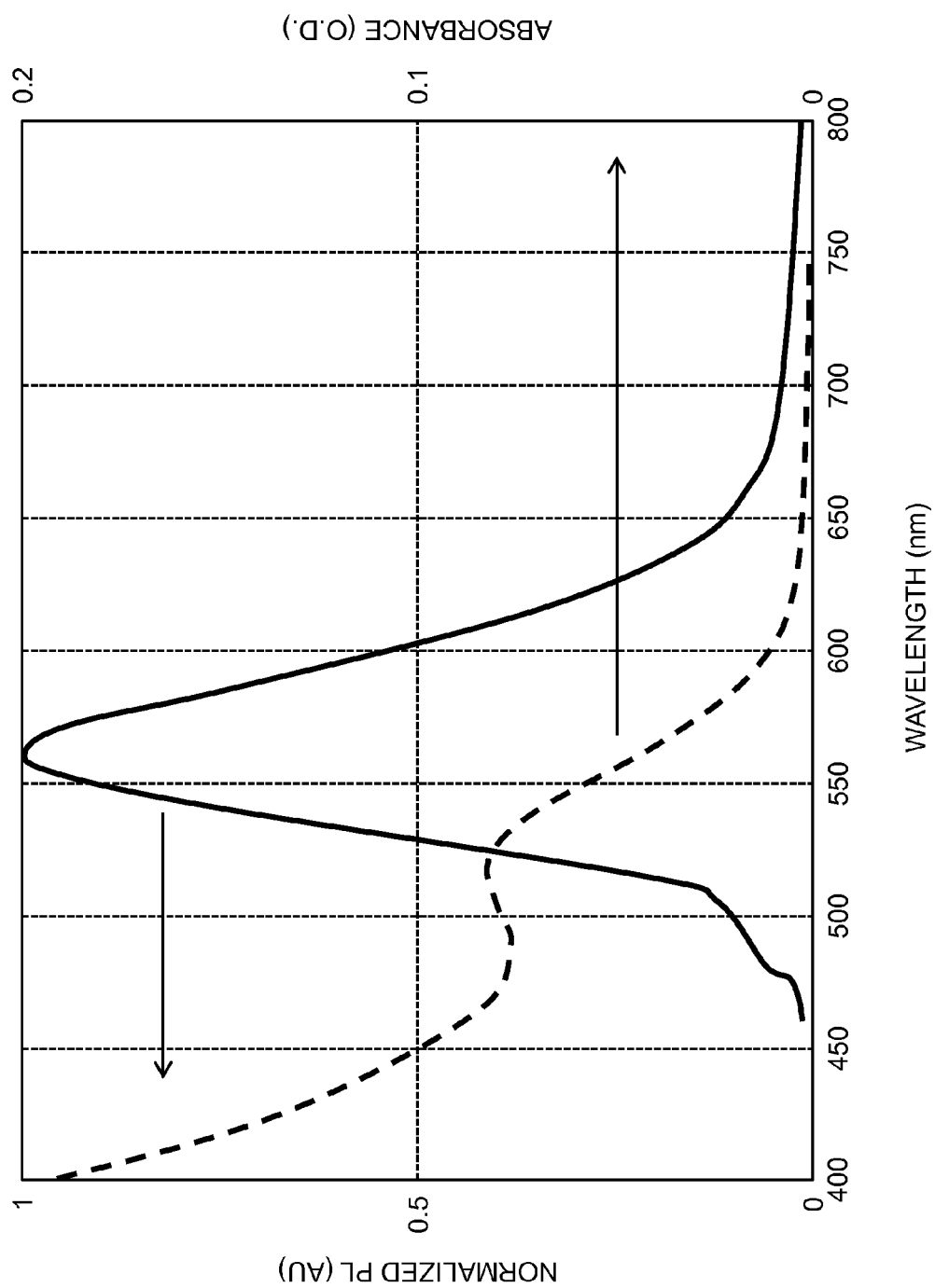
FIG. 2 is a plot showing data for the absorbance and photoluminescence response of the invented core-shell high confinement semiconductor nanocrystals.

Relative quantum yield measurements were performed on the nanocrystals by procedures well-known in the art. The comparison fluorescent material was Rhodamine 6G, which has an absolute quantum efficiency of 0.95. The crude nanocrystal solutions were dissolved in toluene to make the quantum yield measurements. The resulting nanocrystals of Example I-1 had a relative quantum efficiency of 84% (room temperature) at an excitation wavelength of 472 nm. FIG. 2 shows data for the wavelength-dependent absorbance and photoluminescent response of the inventive nanocrystals. The data shows that the nanocrystals had an emission peak at 563 nm and a spectral full width at half maximum (FWHM) of 72 nm.

Example I-2

Preparation of the Inventive Shelled High Confinement Semiconductor Nanocrystals, InP/InGaP/ZnSe/ZnSeS All synthetic routes were carried out using standard airless procedures with a dry box and a Schlenk line. In one growth step both the compact homogenous semiconductor region 105, composed of InP, and the gradient alloy region 110, composed of InGaP, are formed. 0.12 g (0.52 mmol) myristic acid, 0.045 g (0.1 mmol) Zn undecylenate and 7 ml ODE were loaded into a three neck flask. The mixture was degassed at 100° C. for 1 hour. After switching to $N_2$ overpressure, the flask contents were heated to 300° C., while vigorously stirring its contents. Two precursor solutions were prepared and loaded into corresponding syringes. The first precursor solution contained 0.013 g (0.08 mmol) trimethylindium, 0.012 g (0.048 mmol) tris(trimethylsilyl)phosphine, 0.08 mmol oleylamine and 2 ml ODE; the second precursor solution contained 0.013 g (0.08 mmol) triethylgallium, 0.08 mmol oleylamine and 1.5 ml ODE. When the reaction flask reached 300° C., the first syringe was quickly injected into the hot flask to form InP. After a time delay of 0.5 to 1.0 s, the second syringe was rapidly injected into the hot flask to form the gradient alloy region of InGaP. After the second injection, the flask temperature was lowered to 270° C. and the nanocrystals were grown for 36 minutes in total. The reaction was stopped by removing the heating source.

The above III-V based nanocrystals were shelled with wide bandgap II-VI materials. After the reaction flask was cooled to room temperature under continuous stirring, 150 ul (2.6 mmol) degassed acetic acid was loaded into a syringe and then injected into the flask. This was followed by annealing the contents of the flask for 60 minutes at 240° C. The reaction flask was then cooled to 190° C., 0.5 ml (1.5 mmol) oleylamine was injected into the flask, and its contents were annealed at 190° C. for 10 minutes.

Two ZnSeS-based shells were grown on the etched nanocrystals by the following procedure. The first solution of 0.315 mmol DEZ and 1 ml ODE was added dropwise to the reaction mixture under vigorous stirring; the flask contents were then annealed at 190° C. for 10 minutes to form a one-half monolayer of Zn. Next, a second solution of 0.028 g (0.35 mmol) selenium, 200 ul tri-n-butylphosphine, and 1.5 ml ODE was added dropwise to the reaction mixture under vigorous stirring; the flask contents were then annealed at 190° C. for 10 minutes to form a one-half monolayer of Se. The second shell of $ZnSe_{0.25}S_{0.75}$ (by material content) was grown by dripping in a solution of 0.61 mmol DEZ, 200 ul tri-n-butylphosphine, 0.01 g (0.13 mmol) selenium, 0.012 g (0.037 mmol) sulfur, and 2.5 ml ODE under vigorous stirring. The flask contents were then annealed at 190° C. for 10 minutes.

The resulting nanocrystals had a relative quantum efficiency of 74% (room temperature) at an excitation wavelength of 472 nm. The photoluminescence data shows that the nanocrystals had an emission peak at 547 nm and a spectral FWHM of 57 nm.

Example I-3

Preparation of Prior Art Shelled InP-Based Nanocrystals, InP/ZnSe/ZnSeS

The InP cores were formed by the following process. 0.12 g (0.52 mmol) myristic acid, 0.045 g (0.1 mmol) Zn undecylenate and 7 ml ODE were loaded into a three neck flask. The mixture was degassed at 100° C. for 1 hour. After switching to $N_2$ overpressure, the flask contents were heated to 300° C., while vigorously stirring its contents. Two precursor solutions were prepared and loaded into corresponding syringes. The first precursor solution contained 0.013 g (0.08 mmol) trimethylindium, 0.012 g (0.048 mmol) tris(trimethylsilyl) phosphine, 0.08 mmol oleylamine and 2 ml ODE; the second precursor solution contained 0.013 g (0.08 mmol) trimethylindium, 0.08 mmol oleylamine and 1.5 ml ODE. When the reaction flask reached 300° C., the first syringe was quickly injected into the hot flask. After a time delay of 0.5 to 1.0 s, the second syringe was rapidly injected into the hot flask. After the second injection, the flask temperature was lowered to 270° C. and the nanocrystals were grown for 36 minutes in total. The reaction was stopped by removing the heating source.

The above III-V based nanocrystals were shelled with wide bandgap II-VI materials. After the reaction flask was cooled to room temperature under continuous stirring, 150 ul (2.6 mmol) degassed acetic acid was loaded into a syringe and then injected into the flask. This was followed by annealing the contents of the flask for 60 minutes at 240° C. The reaction flask was then cooled to 190° C., 0.5 ml (1.5 mmol) oleylamine was injected into the flask, and its contents were annealed at 190° C. for 10 minutes.

Two ZnSeS-based shells were grown on the etched nanocrystals by the following procedure. The first solution of 0.315 mmol DEZ and 1 ml ODE was added dropwise to the reaction mixture under vigorous stirring; the flask contents were then annealed at 190° C. for 10 minutes to form a one-half monolayer of Zn. Next, a second solution of 0.028 g (0.35 mmol) selenium, 200 ul tri-n-butylphosphine, and 1.5 ml ODE was added dropwise to the reaction mixture under vigorous stirring; the flask contents were then annealed at 190° C. for 10 minutes to form a one-half monolayer of Se. The second shell of $ZnSe_{0.25}S_{0.75}$ (by material content) was grown by dripping in a solution of 0.61 mmol DEZ, 200 ul tri-n-butylphosphine, 0.01 g (0.13 mmol) selenium, 0.012 g (0.037 mmol) sulfur, and 2.5 ml ODE under vigorous stirring. The flask contents were then annealed at 190° C. for 10 minutes.

The resulting nanocrystals had a relative quantum efficiency of 78% (room temperature) at an excitation wavelength of 472 nm. The photoluminescence data shows that the nanocrystals had an emission peak at 554 nm and a spectral FWHM of 53 nm.

Example I-4

Preparation of the Inventive Compact Homogenous Semiconductor Nanocrystals, InP

Compact homogenous semiconductor regions 105, composed of InP, were formed by the following procedure. 0.12 g (0.52 mmol) myristic acid, 0.045 g (0.1 mmol) Zn undecylenate and 7 ml ODE were loaded into a three neck flask. The mixture was degassed at 100° C. for 1 hour. After switching to $N_2$ overpressure, the flask contents were heated to 300° C., while vigorously stirring its contents. Two precursor solutions were prepared and loaded into corresponding syringes.

The first precursor solution contained 0.013 g (0.08 mmol) trimethylindium, 0.012 g (0.048 mmol) tris(trimethylsilyl) phosphine, 0.08 mmol oleylamine and 2 ml ODE; the second precursor solution contained 10.0 ml ODE. When the reaction flask reached 300° C., the first syringe was quickly injected into the hot flask to form InP. After a time delay of 0.5 to 1.0 s, the second syringe was rapidly injected into the hot flask, resulting in an immediate and large drop in the flask temperature. Simultaneously, the hot flask was removed from its heat source.

Figure 3:
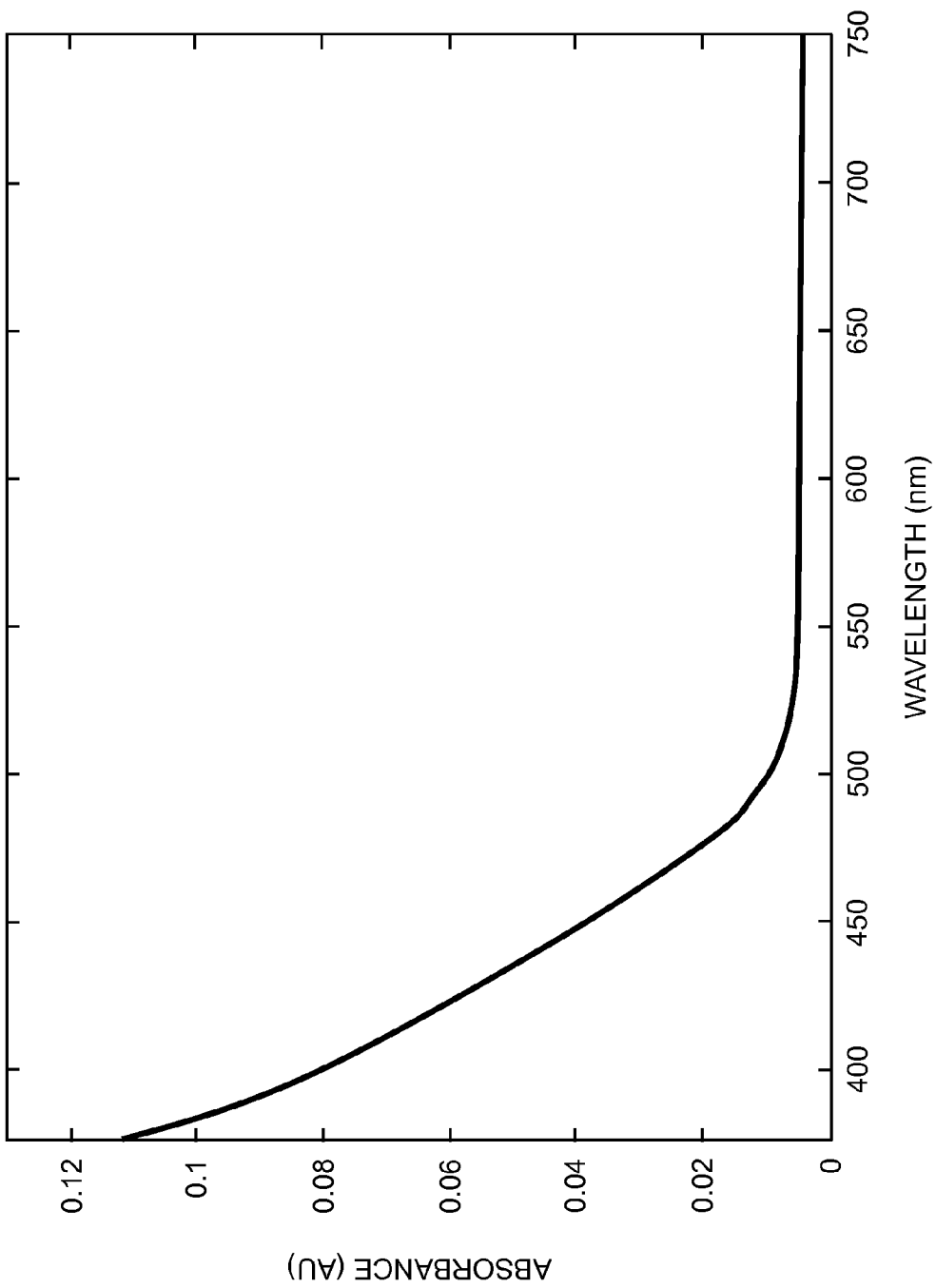
FIG. 3 is a plot showing data for the absorbance of nanocrystals comprised of the invented compact homogenous semiconductor region.

The resulting color of the crude solution at room temperature was yellow. FIG. 3 shows the absorbance of the crude solution. The data from Talapin (D. Talapin et al., J. Phys. Chem B 106, 12659 (2002)) can be used to gauge the size of the compact homogenous semiconductor regions 105 composed of InP. In that article, data of theirs shows that for 1.7 nm diameter InP nanocrystals, the absorbance curve begins to increase at ~540 nm. FIG. 3 shows that the absorbance curve begins to rise at ~510 nm. Consequently, the InP-based compact homogenous semiconductor regions 105 likely have a size of ~1.6 nm. As such, the compact homogenous semiconductor regions 105 (see Example I-1) that resulted in high quantum efficiencies at high temperatures have sizes near the middle of the desired 1.0 to 2.0 nm size range.

Temperature Dependent Photoluminescence Measurements

Figure 4:
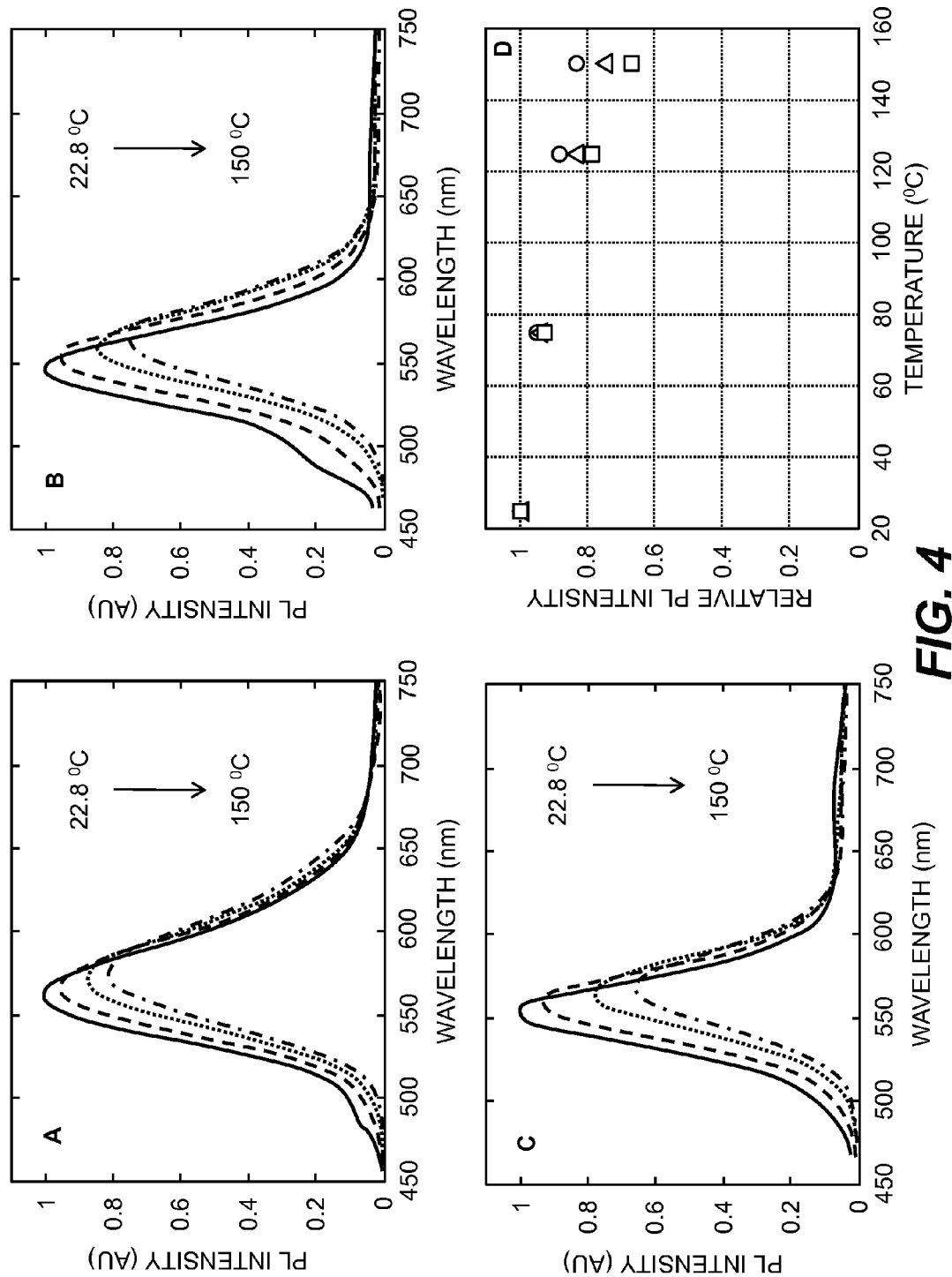
FIG. 4 includes four plots showing the temperature dependent photoluminescent response of: A) the inventive nanocrystals with three shell layers; B) the inventive nanocrystals with two shell layers; C) the prior art nanocrystals; and D) all three nanocrystal types.

The temperature dependences of the photoluminescent (PL) response of the nanocrystals (both inventive and prior art) were measured from room temperature up to 150° C. The measurements were performed using cuvettes filled with 1 ml of the corresponding nanocrystal crude solution and 2 ml of ODE. The excitation wavelength was 450 nm and the PL was measured using a monochrometer. Measurements were taken both upon heating the solutions up to 150° C. and back down to room temperature. At all temperature points, the same PL was obtained for both the heating and cooling phases. The results of the measurements are shown in FIGS. 4A-D. FIGS. 4A-4C correspond to the temperature-dependent photoluminescent response of the inventive nanocrystals with three shell layers, the inventive nanocrystals with two shell layers, and the prior art nanocrystals with two shell layers, respectively. FIG. 4D plots the integrated PL response of each nanocrystal type as a function of temperature, with the circles, triangles, and squares corresponding to the data from FIGS. 4A-4C, respectively. Overall FIG. 4 shows that the inventive nanocrystals with three shell layers had the best temperature response, losing only 17% in photoluminescence intensity at 150° C. This compares with a drop of 33% in photoluminescence intensity (at 150° C.) for the prior art nanocrystals, a factor of two poorer temperature stability. Additionally, the figure showed that improving the shell quality (going from two shell layers to three shell layers) resulted in a 50% increase in temperature stability at 150° C. InP-based inventive and prior art nanocrystals were also synthesized using a simpler shell composed purely of ZnSe. In these cases, the inventive and prior art nanocrystals lost 39% and 57% in photoluminescence intensity at 150° C., respectively. Thus, regardless of the quality of the shelling, nanocrystals with the inventive enhanced confinement (as illustrated in FIG. 1) had superior temperature stability compared with prior art nanocrystals comprised of typical cores. These results are in line with the previous comments that not only should the electron and hole wavefunctions be tightly confined to the core center region (to reduce the electron-phonon interaction), but that they also should be prevented from sampling the nanocrystal surface, where temperature-dependent defects are more common. Finally, the temperature-dependent absorbance of the nanocrystals from Example I-1 was measured, which showed that the absorbance at 450 nm decreased from room temperature to 150° C.; more specifically, it dropped by 9.2%. Combining this absorbance data with the temperature-dependent PL data, results in the quantum efficiency only falling by 10% at 150° C. relative to its efficiency value at room temperature (84%). Hence the quantum efficiency of the invented nanocrystals from Example I-1 at 150° C. is 76%. The significance of this temperature-stable efficiency is best seen when compared to that of typical CdSe nanocrystals. In that case the PL intensity falls off significantly below 100° C., more specifically it drops by ~62% at 90° C. (N. Pradhan et al., J. Amer. Chem. Soc. 129, 3339 (2007)).

In summary, the core/shell high confinement nanocrystals of examples I-1 and I-2 exhibit high quantum efficiency at both room temperature and at elevated temperatures (150° C.). As such, they would be effective materials to be used in high temperature applications, such as, lasers and high power LEDs.

The invention has been described in detail with particular reference to certain preferred embodiments thereof, but it will be understood that variations and modifications can be effected within the spirit and scope of the invention.

| PARTS LIST | |
|---|---|
| 100 | high confinement semiconductor nanocrystal |
| 105 | compact homogenous semiconductor region |
| 110 | gradient alloy region |

The invention claimed is:

1. A method of making a colloidal solution of high confinement semiconductor nanocrystals, comprising:
    (a) forming a first solution by combining a solvent, growth ligands, and at most one semiconductor precursor;
    (b) heating the first solution to a nucleation temperature;
    (c) adding to the first solution, a second solution having a solvent, growth ligands, and at least one additional and different precursor that includes binary or ternary II-VI, III-V, or IV-VI semiconductor materials in the first solution to form a crude solution of nanocrystals having a compact homogenous semiconductor region;
    (d) waiting for 0.5 to 20 seconds and then adding to the crude solution a third solution having a solvent, growth ligands, and at least one additional and different precursor than those in the first and second solutions and includes ternary or quaternary II-VI, III-V, or IV-VI semiconductor materials;
    (e) lowering the nucleation temperature to a growth temperature to enable the formation of a gradient alloy region around the compact homogenous semiconductor region, resulting in the formation of a colloidal solution of high confinement semiconductor nanocrystals.

2. The method of claim 1 further comprising forming single or multiple shell layers on the high confinement semiconductor nanocrystals.

3. The method claim 2 wherein the shell layers are grown to a thickness of 1 to 20 monolayers.

4. The method of claim 2 wherein the shells include binary, ternary, or quaternary II-VI, III-V, or IV-VI semiconductor material, or combinations thereof.

5. The method of claim 1 wherein the nucleation temperature is between 250 to 320° C.

6. The method of claim 1 wherein in step (e) the temperature is lowered by 10 to 50° C.

7. The method of claim 1 further comprising:
(f) adding a weak acid to the crude solution containing the high confinement nanocrystals;
(g) annealing the crude solution at a temperature in a range from 180 to 260° C.; and
(h) adding ligands to the solution to prevent aggregation of the nanocrystals.

8. The method of claim 7 wherein the weak acid is acetic acid.

* * * * *